United States Patent [19]

Suzuki

[11] Patent Number: 4,640,866
[45] Date of Patent: Feb. 3, 1987

[54] PRINTED CIRCUIT BOARD

[75] Inventor: Hirosuke Suzuki, Tokorozawa, Japan

[73] Assignee: Junkosha Company Ltd., Tokyo, Japan

[21] Appl. No.: 718,802

[22] Filed: Apr. 1, 1985

[30] Foreign Application Priority Data

Apr. 10, 1984 [JP] Japan .................................. 59-72472

[51] Int. Cl.$^4$ ............................................ B32B 27/00
[52] U.S. Cl. ................................... 428/422; 174/68.5; 361/397; 361/414; 428/901
[58] Field of Search ................ 174/68.5, 110 FC, 127, 174/110.6, 117 F, 117 FF; 361/395–398, 414; 339/17 R, 17 A, 17 E; 264/127; 428/422, 901, 209

[56] References Cited

U.S. PATENT DOCUMENTS

| 2,728,698 | 12/1955 | Rudner .......................... 174/110 FC |
| 3,421,972 | 1/1969 | Cromwell et al. ............ 174/110 FC |
| 3,486,961 | 12/1969 | Adams ........................... 174/110 FC |
| 4,382,236 | 3/1983 | Suzuki ....................... 174/117 FF X |
| 4,423,282 | 12/1983 | Suzuki et al. ................... 174/110 X |

FOREIGN PATENT DOCUMENTS

| 121010 | 2/1946 | Australia ...................... 174/110 FC |
| 0041097 | 12/1981 | European Pat. Off. ......... 174/117 F |
| 3433834 | 3/1985 | Fed. Rep. of Germany ... 174/117 F |

OTHER PUBLICATIONS

"Metal-Surfaced & Other Fluorocarbon Combinations", Electrical Manufacturing, Mar. 1952, pp. 106–110.

Primary Examiner—Arthur T. Grimley
Assistant Examiner—Jane K. Lau
Attorney, Agent, or Firm—Mortenson & Uebler

[57] ABSTRACT

A printed circuit board is provided comprising at least one layer of metal firmly bonded in laminar contact with at least one layer of solid, sintered polytetrafluoroethylene (PTFE). In one embodiment, the solid PTFE layer contains fibers of porous, expanded, sintered PTFE mixed within it. In another embodiment, the solid PTFE layer is firmly bonded to the metal layer on one side and is firmly bonded on the other side to a layer of porous, expanded, sintered PTFE.

3 Claims, 4 Drawing Figures

PRINTED CIRCUIT BOARD

BACKGROUND OF THE INVENTION

This invention relates to a printed circuit board for transmission of electrical signals at high frequencies, which has a small coefficient of thermal deformation, including thermal expansion and contraction.

There is a conventional printed circuit board commercially available having a small coefficient of thermal deformation which is formed by pasting copper foil on the outer surface of an insulating layer of fiberglass fabric containing polytetrafluoroethylene (PTFE). However, this conventional printed circuit board has a dielectric factor which can be as large as about 0.002 at 10 GHz, and is not often used as a printed circuit board for high frequencies.

A printed circuit board having a high specific permittivity has been proposed, which is formed by pasting copper foil on the outer surface of an insulating layer of polytetrafluoroethylene in which a filler consisting of titanium oxide powder or alumina (aluminum oxide powder) is mixed. However, this printed circuit board has a thermal expansion coefficient with respect to its surface direction and thickness direction of as much as $1 \times 10^{-4}/°$ C. Obviously, it is thermally unstable and cannot preferably be used.

Therefore, it is an object of the present invention to provide a printed circuit board which substantially eliminates the above-mentioned faults of prior art printed circuit boards and eliminates a great increase in the expansion coefficient, even if a filler is mixed therein for the purpose of increasing the specific permittivity to a high level, and which has excellent properties in a high-frequency transmission region.

SUMMARY OF THE INVENTION

A printed circuit board is provided comprising at least one metallic layer firmly bonded in laminar contact with at least one layer of solid, sintered polytetrafluoroethylene (PTFE). The metallic layer may be bonded to the PTFE layer by a bonding agent of a thermoplastic such as a perfluoroalkyl-ether copolymer (PFA) or tetrafluoroethylene-hexafluoropropylene copolymer (FEP). The PTFE layer may contain fibers of expanded, porous PTFE, preferably expanded, porous, sintered PTFE fibers. The printed circuit board preferably has the metallic layer firmly bonded to one side of the solid PTFE layer by a bonding agent and on the other side of the solid PTFE layer is firmly bonded a layer of expanded, porous, sintered PTFE. The PTFE layers may contain a filler such as titanium dioxide powder or aluminum oxide powder. In an alternate embodiment, the layer of solid PTFE has a metallic layer firmly bonded to one side thereof as a result of metal plating thereon and on the other side thereof is firmly bonded to a layer of expanded, porous, sintered PTFE. The layer of expanded, porous PTFE may be a cloth woven of fibers of expanded, porous PTFE, or it may be a layer of expanded, porous PTFE film.

DETAILED DESCRIPTION OF THE INVENTION AND PREFERRED EMBODIMENTS WITH REFERENCE TO THE DRAWINGS

A board for use as a printed circuit board is provided comprising at least one layer of metal firmly bonded in laminar contact with at least one layer of solid, sintered polytetrafluoroethylene (PTFE). In one embodiment, the solid PTFE layer contains fibers of porous, expanded, sintered PTFE mixed within it. In another embodiment, the solid PTFE layer is firmly bonded to the metal layer on one side and is firmly bonded on the other side to a layer of porous, expanded, sintered PTFE.

The present invention, in one embodiment, provides a printed circuit board with an insulating layer containing a porous polytetrafluoroethylene material firmly bonded to and in laminar contact with a layer of solid polytetrafluoroethylene.

According to this printed circuit board thus constructed, the substrate is formed of a layer of solid polytetrafluoroethylene, so that the printed circuit board has excellent high-frequency characteristics and fully displays its capability as a printed circuit board for high frequencies. Because the porous polytetrafluoroethylene material layer is provided along the layer of solid polytetrafluoroethylene, the pores in the former, the high-frequency characteristics of which are superior to those of the latter, work as heat insulators and stress resistors and substantially prevent a great increase in the thermal expansion coefficient of this board. Therefore, a printed circuit board having a small thermal expansion coefficient and excellent high-frequency characteristics can be provided.

In this printed circuit board, the porous polytetrafluoroethylene material may be mixed in the form of fibers mixed into the layer of solid polytetrafluoroethylene, or laminated thereon in the form of a cloth of fibers of the mentioned porous material, or in the form of a film thereof. If the porous polytetrafluoroethylene material is used in the form of expanded polytetrafluoroethylene material, a porosity of 90% can be obtained, and this provides an efficient heat insulating and stress-resisting material. If this expanded resin material is sintered and used in the form of sintered fibers or sintered layer material, the mechanical strength of the printed circuit board increases, and improved performance can be obtained. A filler consisting of titanium oxide powder or aluminum oxide powder (alumina powder) to increase the specific permittivity can be mixed in the layer of solid polytetrafluoroethylene or into the porous polytetrafluoroethylene material or both of them.

The present invention and preferred embodiments is best described in detail with reference to FIGS. 1-4.

Figure 1:
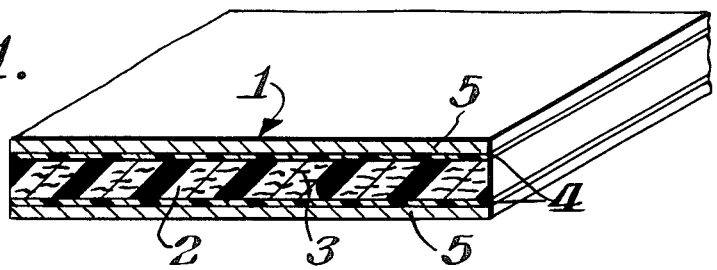
FIG. 1 is a schematic view, partly in cross-section, showing a printed circuit board of this invention.

FIG. 1 is a schematic diagram of a section of a printed circuit board 1 according to the present invention. In this printed circuit board 1, layers of copper foil 5 are bonded to both surfaces of a layer of solid polytetrafluoroethylene layer 3 in which the expanded, porous polytetrafluoroethylene fibers 2 are mixed, using bonding agent 4, and this printed circuit board can be formed into an etched circuit pattern, not shown, by conventional techniques.

The expanded, porous polytetrafluoroethylene fiber 2 referred to above is manufactured by, for example, a method disclosed in U.S. Pat. No. 3,953,566.

A printed circuit board of the construction shown in FIG. 1, having a thickness of 0.6 mm was formed by extrusion-molding polytetrafluoroethylene in which 10% by weight of sintered, expanded, porous polytetrafluoroethylene fiber which had been stretched 10 times its original length and which consisted of fiber pieces 10 μm in thickness and 5 mm in length was mixed, and the resultant product was sintered to obtain a layer of sintered, solid polytetrafluoroethylene 3, attaching to both surfaces of the layer 3 layers of 10 μm in thickness of a thermoplastic bonding agent 4 consisting of a layer of polytetrafluoroethylene-perfluoroalkyl vinyl ether copolymer (PFA) or a tetrafluoroethylene-hexafluoropropylene copolymer (FEP), and attaching to the outer surfaces of the layers 4 layers of 35 μm in thickness of copper foil or aluminum foil, and heating the resultant product so as to unite all of the layers. The properties of this printed circuit board were measured. Good results were obtained, i.e. the dielectric loss factor and the thermal expansion coefficient with respect to the surface direction thereof were $1 \times 10^{-4}$ and $1 \times 10^{-5}$, respectively.

Figure 2:
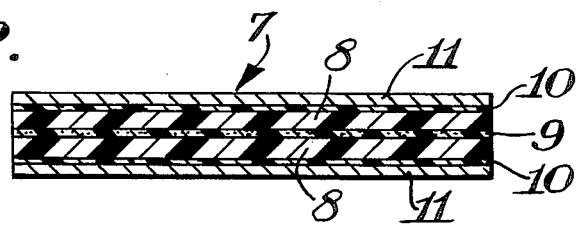
FIGS. 2-4 are cross-sectional views of alternate embodiments of printed circuit boards according to the invention.

FIG. 2 is a cross-sectional view of a printed circuit board 7 in another embodiment of the present invention. In this printed circuit board 7, a layer of 5 mil in thickness of sintered, expanded, porous polytetrafluoroethylene 9 is inserted between two layers of sintered, solid polytetrafluoroethylene 8, and layers of conductive metal foil 11 consisting of copper foil or aluminum foil are attached to the outermost surfaces of the layers 8 by layers of a bonding agent 10.

It was ascertained that the printed circuit board 7 in this embodiment had essentially the same properties as the printed circuit board 1 in the embodiment shown in FIG. 1.

Figure 3:
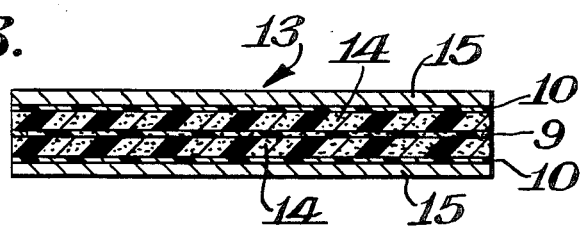

FIG. 3 shows a modified example of the embodiment of FIG. 2. In this example, about 15 percent by weight of titanium oxide powder, for example, titanium dioxide ($TiO_2$) powder, to increase the specific permittivity, is mixed to the layers of solid polytetrafluoroethylene 14 which are laminated onto both surfaces of a layer of porous, expanded polytetrafluoroethylene 9, as shown.

Titanium dioxide powder having a specific permittivity in the range of 2.2 to 10 is suitable for this purpose.

In this embodiment, 18 μm thick copper foil is used as the conductive metal foil 15, and this embodiment also has excellent characteristics.

Figure 4:
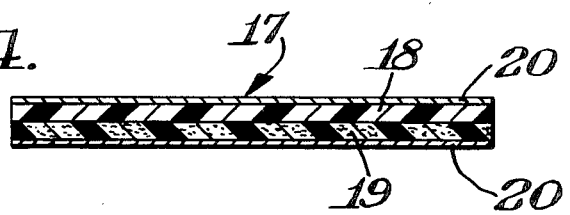

FIG. 4 is a sectional view of a printed circuit board 17 in a further embodiment of the present invention. The insulating layer in the printed circuit board 17 in this embodiment consists of a lamination of a layer of solid polytetrafluoroethylene 18 and a layer of porous, expanded polytetrafluoroethylene 19. Catalyst layers 20, in which plating medium nuclei are dispersed, are provided on the outer surfaces of these layers 18 and 19. For example, palladium salt is dispersed in these catalyst layers 20. These catalyst layers 20 may be formed so that the nuclei of the plating catalyst are dispersed in the surface portion of the printed circuit board as a whole, or so that the nuclei of the plating catalyst are formed in the shape of a circuit pattern by an optical reaction. In the latter case, a circuit pattern can be obtained easily by carrying out a conventional chemical copper-plating operation. In the former case, a conductive circuit pattern is obtained by providing through holes, through which the circuit elements are fastened, in a printed circuit board, permanently masking the non-circuit portions, subjecting the circuit portion to a surface treatment so that a plating operation can be carried out smoothly, and then immersing the resultant product in a chemical copper-plating liquid so as to be plated therewith. The insulating layer employing such a catalyst layer in which the nuclei of the plating catalyst are dispersed is not limited to the insulating layer in the embodiment of FIG. 4. It can also be applied to the insulating layers in the embodiments of FIGS. 1-3.

According to this invention described above, which provides a printed circuit board having an insulating layer which contains porous, expanded polytetrafluoroethylene material and which extends along a layer of solid polytetrafluoroethylene, the layer of solid polytetrafluoroethylene having excellent high-frequency transmission characteristics and the porous, expanded polytetrafluoroethylene material having excellent high-frequency transmission characteristics and, in addition, excellent heat-insulating characteristics and stress-resisting capability, are combined organically. Therefore, a printed circuit board having excellent high-frequency transmission characteristics and a small thermal expansion coefficient can be obtained.

The present invention is not limited to the above embodiments; it may be modified and practiced in various ways within the scope of the concept of the invention by, for example, using elongated fibers of porous, expanded polytetrafluoroethylene material or a cloth of porous, expanded polytetrafluoroethylene; or providing a layer of solid polytetrafluoroethylene between the layers of porous polytetrafluoroethylene material and then forming a circuit pattern on the outer surfaces of these layers of porous polytetrafluoroethylene material.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A printed circuit board comprising a composite center layer of two layers of solid, sintered, nonporous polytetrafluoroethylene (PTFE) with a central layer of porous, expanded PTFE sandwiched therebetween, each of said solid PTFE layers having a metallic layer bonded to its outer surface by a bonding agent selected from the class consisting of a perfluoroalkylether copolymer (PFA) and tetrafluoroethylene-hexafluoropropylene copolymer (FEP).

2. The printed circuit board of claim 1 wherein said solid PTFE layers contain therein fibers of expanded, porous PTFE.

3. The printed circuit board of claim 2 wherein said fibers are sintered.

* * * * *